United States Patent [19]

Nenov

[11] Patent Number: 5,303,705
[45] Date of Patent: Apr. 19, 1994

[54] EVOKED 23NA MR IMAGING OF SODIUM CURRENTS IN THE BRAIN

[76] Inventor: Valeriy I. Nenov, 848 - 18th St., #5, Santa Monica, Calif. 90403

[21] Appl. No.: 877,950
[22] Filed: May 1, 1992
[51] Int. Cl.$^5$ .............................................. A61B 5/055
[52] U.S. Cl. ................................................. 128/653.2
[58] Field of Search ..................... 128/653.2; 324/307, 324/309

[56] References Cited

U.S. PATENT DOCUMENTS

| | | |
|---|---|---|
| 4,409,550 | 10/1983 | Fossel . |
| 4,710,717 | 12/1987 | Pelc et al. .......................... 128/653.2 |
| 4,719,425 | 1/1988 | Ettinger . |
| 4,779,619 | 10/1988 | Winkler ............................ 128/653.2 |
| 4,803,432 | 2/1989 | Perman . |
| 4,940,057 | 7/1990 | Kamei ............................... 128/653.2 |
| 4,982,161 | 1/1991 | Twieg . |
| 5,076,275 | 12/1991 | Bechor et al. ..................... 128/653.2 |

OTHER PUBLICATIONS

Paul J. Keller, Ph.D. "Basic Principles of Magnetic Resonance Imaging", St. Joseph's Hospital Phoenix, AZ, Jun. 1988, pp. 5-29.
Michael K. Stehling, et al., "Echo-Planar Imaging: Magnetic Resonance Imaging in a Fraction of a Second", Science, vol. 254, pp. 43-50, (1991).
Patrick Le Rouz, et al., "Burst Excitation Pulses", Proc. SMRM., 1991, p. 269.
J. Hennig, et al., "Fast Imaging Using Burst Excitation Pulses", Proc. SMRM., 1988, p. 238.
Hilal, S. K. et al., (1987), "Sodium Imaging", in D. D. Stark and W. G. Bradley (eds.), Magnetic Resonance Imaging, pp. 715-791, St. Louis: Mosby.
Camrine, et al., "Intracellular Concentration of Sodium and Other Elements as Related to Mitogenesis and Oncogenesis in Vivo", Cancer Research, 40: 1493-1500 (1980).
Robert B. Lufkin, "Magnetic Resonance Image Formation", in R. B. Lufkin (ed), The MRI Manual, pp. 42-79, Chicago, Illinois Year Book Medical Publishers (1990).
Perman et al., "Methodology of Invivo Human Sodium NMR Imaging at 1.5 Tesla", Radiology, 160:811-820 (1986).
Koester, "Nongated Channels and Passive Membrane Properties of the Neuron", in E. R. Kandel and J. H. Schwartz (eds.), Principles of Neuro Science, pp. 58-65, New York, NY (1985).
Robert P. Crease, "Images of Conflict: MEG vs. EEG", Science, vol. 253, pp. 374-375, Jul. 1991.
S. S. Winkler, et al., "Regional T2 and Sodium Concentration Estimates in the Normal Human Brain by Sodium-23 MR Imaging at 1.5T", Journal of computer Assisted Temo. 561-566 1989.
C. M. J. Van Uijen, et al., "Driven-Equilibrum Radiofrequency Pulses in NMR Imaging", Magnetic Resonance in Medicine 1, 502-507 (1984).
J. B. Ra, et al., "Algorithm for MR Imaging of the Short T2 Fraction of Sodium using the FID Signal", Journal of Computer Assisted Tomography, vol. 13(2), 302-309 (1989).
K. K. Hilal et al., "Vivo NMR Imaging of Sodium-23 in the Human Head", Journal of Computer Assisted Tomography, vol. 9(1), 1-7 (1985).
Bo K. Siesjö, "Brain Energy Metabolism", John Wiley & Sons, 36-37.
S. S. Winkler, "Sodium-23 Magnetic Resonance Brain Imaging", Neuroradiology, 32: 416-420 (1990).

*Primary Examiner*—Ruth S. Smith

[57] ABSTRACT

A system and method of Evoked Sodium Magnetic Resonance Imaging (ESMRI) for three-dimensional localization and measurement of sodium currents in the brain during neuronal activity is disclosed. The system measures neuronal activity in response to a stimulus. The sodium MRI measures changes in the sodium concentration due to the influx of sodium into neurons during the generation of synaptic and action potentials. The system measures primarily extracellular sodium which is distinguished from intracellular sodium on the basis of different spin-spin relaxation rates (T2) for these two compartments. Repeated measurements of sodium concentrations are used to produce and display the changes in concentration cinematically. The technique of the present invention is noninvasive and produces three-dimensional brain images with sufficient spatial and temporal resolution to allow three-dimensional visualization of the sequence of neuronal activation in the brain during processing of sensory, motor, cognitive and other tasks.

23 Claims, 6 Drawing Sheets

Frame #1
(0 to 40 msec)

Frame #2
(40 to 80 msec)

Frame #3
(80 to 120 msec)

Frame #4
(120 to 160 msec)

EVOKED 23NA MR IMAGING OF SODIUM CURRENTS IN THE BRAIN

BACKGROUND OF THE INVENTION

1. Technical Field

The present invention relates to techniques for localization and measurement of the dynamics of neuronal activity associated with information processing in the brain, and more particularly to systems and methods for using sodium-23 magnetic resonance imaging to measure evoked neuronal activity in the brain.

2. Discussion

The pursuit of methods for measurement and 3-D localization of neuronal activity associated with information processing in the brain has inspired much research in electrophysiology, radiology, nuclear medicine, biophysics, scientific visualization, and other disciplines. Such methods provide important uses in many areas including basic research into the functioning of the brain; early diagnosis of brain diseases; and assessment of post-therapeutic and postoperative brain functions. Nevertheless, present day technologies still fall short of realizing these goals. There remains no satisfactory technique to visualize in 3-D the sequence of activation of brain nuclei and cortices during the processing of various sensory, motor, cognitive, and other tasks.

Current techniques for measurement of brain activity generally fall into two categories: direct and indirect measurement techniques. Direct approaches include Electroencephalography (EEG), Evoked Potentials (EP) and Magnetoencephalography (MEG). Indirect techniques include Positron Emission Tomography (PET) of glucose metabolism or Cerebral Blood Flow (CBF) and Single Photon Emission Computed Tomography (SPECT).

The direct techniques of EEG and EP are widely available and represent a relatively inexpensive technology for measurement of brain potentials. These techniques use scalp or depth implanted electrodes to acquire the signal. A major shortcoming is that they do not allow for unambiguous localization of the intracranial potential generators. Rather, scalp EEG/EP at best provide a temporal sequence of 2-D maps each of which represents the momentary spatial distribution of the brain potentials as they appear on the scald, whereas depth EEG/EP provide very localized measures of the potential in the vicinity of implanted electrodes. Magnetoencephalography (MEG) is a relatively new and expensive technology (systems may cost up to $3,000,000) for remote sensing (non-invasive measurement) of the magnetic fields associated with the electric currents produced during neuronal activity. MEG uses SQUID (Superconducting Quantum Interference Device) magnetometers to detect weak magnetic fields outside the brain.

EEG and MEG are complimentary since they measure two manifestations of the same physical phenomenon—the ionic currents underlying neuronal activity. (EEG measures the electric fields, whereas MEG measures the magnetic fields generated by these currents.) However, when used to determine the intracranial localization of field generators, both techniques require solving what is known as the "inverse problem". This is an ill-posed problem of reconstruction of the location and strength of the generators in the brain from data measured on the surface of the brain. The limitations with this method are: (1) current compartmental models make many simplifications about the dielectric properties of the brain which may compromise the accuracy of the solution; (2) even if there were accurate models, there is not a unique solution to the inverse problem. That is, any given scalp EP field distribution could theoretically be generated by an infinite variety of intracerebral source distributions.

The indirect techniques for observation of neuronal activation such as PET and SPECT have their own drawbacks: (1) these techniques have insufficient temporal resolution, which is at best in the range of 60 seconds; (2) these techniques measure indirect correlates of the neuronal activity, such as blood flow or glucose metabolism. These variable have dynamics which lag behind the neuronal activity which evoke them by at least 1 second or more. Also, the response is smeared in time and has non-linear relation to the underlying neuronal activity.

Besides the unsatisfactory results for localization of neuronal activity, all of the above techniques present additional disadvantages. For example, EEG and EP are invasive, since they require attachment or implantation of electrodes. PET and SPECT require the administration of radionucleotides (e.g., 18-FDG, 15-O water., IMP, 133-Xenon). Further, 3-D brain imaging has not been possible with the techniques of EEG and MEG. An additional disadvantage with techniques such as PET, SPECT and MEG is that they require a large investment in equipment thus posing a serious barrier to their widespread implementation.

Thus, it would be desirable to provide a system and method for simultaneously visualizing neuronal activity in all areas of the brain. Also, it would be desirable to provide a system and method for visualizing the sequence of activation of brain nuclei and cortices which underlie various sensory, motor, cognitive and other tasks. In addition, it would be desirable to provide such a technique which has sufficient temporal resolution to resolve rapidly changing neuronal activity. Further, it would be desirable to provide such a technique for localization of neuronal activation in the brain which directly measures this activity as opposed to measuring indirect correlates. It would also be desirable to provide such a technique which is not invasive and which does not require administering any substances into the brain. Further, it would be desirable to provide such a technique which provides sufficient spatial resolution to resolve fine spatial details within the brain. Also, it would be desirable to provide a technique with these features which produces brain images which are three-dimensional. Additionally, it would be desirable to provide such a system which can be implemented at a reasonable cost.

SUMMARY OF THE INVENTION

In accordance with the present invention, a method is provided for measuring neuronal activity in a subject's brain. In particular, the present invention uses sodium-23 magnetic resonance imaging to measure the transmembrane sodium currents associated with excitatory post synaptic potentials generated during interneuronal synaptic signaling and the resulting action potentials. The method includes the steps of first causing the subject to produce neuronal activity, and then imaging the subject's brain (during the evolving neuronal activity) using a magnetic resonance imaging (MRI) apparatus. This MRI apparatus is adapted to measure nuclear magnetic resonance emissions from sodium atoms. A plurality of averaged 3-D MRI images are gathered and the results are displayed. Each of these MRI images is a measure of the momentary sodium concentration in the brain. The sequence of images as a whole yields a localization of the changes in the sodium concentration in the extracellular compartment of the brain, which correlates with the neuroanatomical location of the neuronal activity.

In accordance with another embodiment of the present invention, a system is provided for measuring neuronal activity in a subject's brain. The system includes a means for causing said subject to produce neuronal activity, and an MRI apparatus adapted to measure the momentary sodium concentration within a matrix of voxels covering a region of said subject's brain. In addition, the system includes a means for gathering a plurality of these images over a sequence of time, and a means for displaying the plurality of images which reveals changes in the sodium concentration of the subject's brain resulting from neuronal activity.

The system and method of the present invention thereby create images of the change in sodium concentration within certain regions of the brain with sufficient temporal and spatial resolution to reveal the location of neuronal activity. The system is not invasive and, to a large extent, can make use of existing MRI equipment already available in many facilities.

BRIEF DESCRIPTION OF THE DRAWINGS

The various advantages of the present invention will become apparent to one skilled in the art by reading the following specification and by reference to the following drawings in which.

DESCRIPTION OF THE PREFERRED EMBODIMENTS

Figure 1:
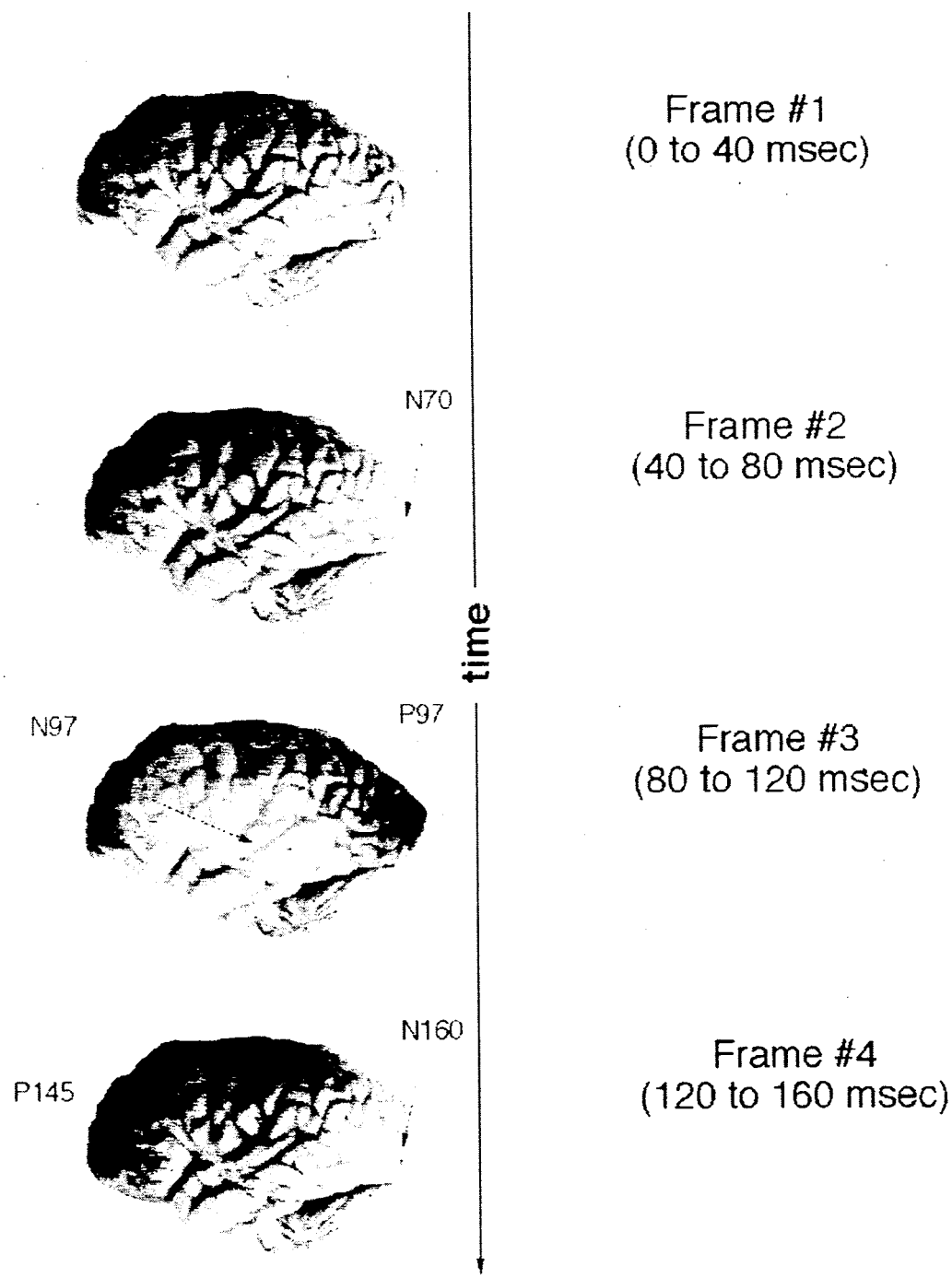
FIG. 1 is an artist's view of a series of 3-D, surface-rendered, gray-scale MRI images of a human brain indicating time sequence of neuronal activation in response to visual stimulation by checkerboard pattern reversal.

The present invention employs sodium-23 magnetic resonance imaging ($^{23}$Na-MRI) for localization and measurement of the dynamics of neuronal activity associated with information processing in the brain. Sodium-23 MRI is an attractive alternative to existing techniques for measuring neuronal activity for a number of reasons: (1) it is noninvasive since it does not require attachment or implantation of electrodes (as in EEG/EP), nor does it require the administration of substances such as radionucleotides (as in PET); (2) sodium-23 MRI allows the acquisition of 3-D data which can be cross-sectioned and viewed at arbitrary angles; (3) it provides sufficient spatial resolution which is equal or better than the resolution in PET although not as good as the resolution in proton MRI; (14) the temporal resolution of sodium MRI is much better than that of PET and is theoretically better than the temporal resolution in proton MRI; (5) there is a high potential for rapid widespread utilization because the well-developed field of proton MRI can be readily adapted to sodium MRI.

In addition to the above factors which make sodium MRI an attractive approach from a practical standpoint, a consideration of the biological and nuclear magnetic properties of sodium reveal it to be an ideal vehicle for monitoring of information flow in the brain.

With regard to the biological properties of sodium (hereinafter referred to as either Na$^+$ or $^{23}$Na), it is important to note that currents in the brain across cell membranes and in the extra-cellular (EC) and intracellular (IC) spaces are carried by a small number of charged particles which generally comprise the following ions: Na$^+$, K$^+$, Cl$^-$, and Ca$^{++}$. Na$^+$ is the second most abundant ion in the brain after hydrogen ions or protons (H$^+$). The isotope $^{23}$Na comprises virtually 100% of the naturally occurring sodium. Its concentration is highest in the extracellular space (also called the interstitial space), the blood plasma, and in the cerebrospinal fluid (CSF).

Also, in contrast to H$^+$, there are substantial transmembrane chemical gradients for Na$^+$. The generation of synaptic potentials during inter-neuronal signalling is always accompanied with the influx of Na$^+$ into the neuron. This influx is mostly in the dendritic tree, but also in the cell body (perikaryon or soma) and in the axon during AP generation. The ionic influx (uptake) is accompanied by ionic current in the EC space carried mostly by Na$^+$ and Cl$^-$ (because they are the majority ions). The EC currents generate measurable potential differences (and vice versa) which can be recorded on the scalp as EEG/EP. The decrease of EC concentration of sodium [Na$^+$]$_e$ during neural activity is brought about partly by Na/K substitution. When a neuron is synaptically activated, there is practically no lag in the development of ionic flux across the membrane. On the other hand, the corresponding changes in the membrane potential lag behind the current due to the time constant of the membrane (1 to 20 msec). For a while, uptaken Na$^+$ ions are trapped in the neuron and the original resting balance is slowly restored by ATP-driven Na$^+$/K$^+$ molecular pumps.

Therefore, continuous measurement (or sufficiently fast sampling) of [Na$^+$]$_e$ provides a unique method for monitoring of neuronal activity (information flow) in the neural networks within the nervous system and the brain in particular.

A comparison between the biological properties of $^{23}$Na and $^1$H in the brain is given below as reported in the literature.

| Biological properties | $^{23}$Na | $^1$H |
|---|---|---|
| Average concentration (relative) | 1/2000 | 1 |

| Biological properties | $^{23}$Na | $^1$H |
|---|---|---|
| Normal regional brain concentration: | | |
| interstitial, CBF, and plasma $[Na^+]_e$ | 140 to 160 mM | ≈110M |
| intra-cellular concentration $[Na^+]_e$ | 12 to 20 mM | ? |
| Cortical concentration: | 45 to 53 mM | 85 to 100M |

PRINCIPLES OF MR IMAGING

Before discussing the nuclear magnetic properties of sodium-23, a brief review of nuclear magnetic resonance will be presented. Nuclear magnetic resonance (NMR)imaging, also called magnetic resonance imaging (MRI), is based on the precessional properties of tiny magnetic moments of atomic nuclei. Typically, hydrogen nuclei (protons) in tissue absorb stimulating electromagnetic radiation; subsequent emissions by such nuclei can be detected and used to form high-contrast images. This technique provides more contrast between tissues than is attainable by computed x-ray tomography (CT).

Most chemical elements have at least one reasonably abundant isotope whose nucleus is magnetic. In an external magnetic field such a nucleus (which can be thought of as a small magnet) can assume a low-energy state when aligned with the field, or a higher-energy state when aligned against the field. A weak but rapidly alternating magnetic field of appropriate frequency applied by a coil near the subject or specimen stimulates changes in the orientation of the nucleus relative to the direction of the strong static magnetic field. This results in absorption of energy, which is emitted when the nucleus returns to the equilibrium state. The absorption and emission of energy take place at the resonance frequency as given by the formula $\omega = \gamma B_o$, where $\omega$ is the angular speed measured in radians per second, $\gamma$ is the gyromagnetic ratio characteristic of the nuclear species, and $B_o$ is the static magnetic field. The nuclei of different elements, and even of different isotopes of the same element, have very different frequencies. For example, for a field of 0.1 Tesla (1000 gauss) the resonance frequency of Hydrogen ($^1$H) is 4 MHz and that of Phosphorus ($^{31}$P) is 1.7 MHz.

The majority of medical applications of NMR use protons in the body to make anatomical images of structures. The difference in NMR signal intensity between two tissues is almost invariably greater than the difference in attenuation coefficients of these tissues for penetrating x-rays. Thus, NMR is generally superior to x-ray computed tomography. The high-contrast capability of NMR stems from both the NMR signals' dependence on the density of the resonating nuclei, and the local chemical environment (e.g., tissue water). The tissue environment affects two important relaxation times, called T1 and T2. When the bulk magnetization is perturbed by the excitation pulse, it recovers toward its equilibrium value in an exponential fashion with the time constant T1, known as the spin-lattice relaxation time. T1 values show large variation in different tissues, and are thus a valuable source of tissue contrast. T2 is the spin-spin relaxation time, a measure of decay of the NMR signal itself, which also shows large variation among tissues. These parameters depend on the motions of the nuclei, the regional temperature, the viscosity of the tissue, and the magnetic effects of nearby nuclei.

Spatial information about the density of the observed nuclei can be obtained by imposing a slight gradient on the static magnetic field. Because the resonant frequency of the signal from the nuclei is proportional to the field, it is possible to derive the position of the nuclei by imposing gradients in different directions and detecting the frequencies of NMR signals. Three-dimensional reconstruction can then be performed by using algorithms similar to those used for x-ray computed tomography.

Nuclear magnetic resonance techniques for acquiring information do not have equal sensitivity for all elements; that is, NMR cannot image with the same high spatial resolution the tissue concentration of $^{23}$Na or $^{31}$P, as well as it can measure the concentration of $^1$H in tissue.

NUCLEAR MAGNETIC PROPERTIES OF $^{23}$Na

The $^{23}$Na MR properties have been successfully used for sodium MR imaging. A comparison between $^{23}$Na MR properties and $^1$H properties is given below:

| Nuclear Properties | $^{23}$Na | $^1$H |
|---|---|---|
| Nuclear spin relaxation | 3/2 quadrupolar | 1/2 dipolar |
| Transitions (relaxation rates) | 3(2) | 1 |
| T1 — spin-lattice (longitudinal) relaxation rates: | | |
| Brain tissue | <55 msec | ≈500 msec |
| CSF, BLOOD | ≈50 msec | ≈1,000 msec |
| T2 — spin-spin (transverse) relaxation rates: | | |
| CORTEX | | ≈100 msec |
| IC compartment (short) | 0.7 to 3.0 msec | |
| EC compartment (intermediate) | 8 to 14 msec | |
| BLOOD | ≈20 msec | |
| CSF (long - biexponential decay) | 16 to 60 msec | |
| Gyromagnetic ratio ($\gamma g/2\pi p$) | ≈11 MHz/T (16.9 MHz/1.5T) | ≈43 MHz/T (63.9 MHz/1.5T) |
| Relative MR sensitivity (at constant field and equal number of nuclei) | ≈0.13 | 1 |
| Relative MR sensitivity (at constant field and normal physiological concentrations) | ≈6 × 10$^{-5}$ | 1 |
| Relative image contrast | 7 to 18 | 1 |

STATE-OF-THE-ART IN $^{23}$Na MR IMAGING

Representative of the current techniques forسodium imaging is the work of Winkler et al. at the University of Wisconsin, Madison, and Hilal et al. at Columbia University, New York.

Winkler et al. used a multispin echo sequence to measure the extra-cellular $^{23}$Na concentration. See Winkler et al., "Sodium-23 Magnetic Resonance Brain Imaging," Neuroradiology, 32, 416–420, (1990). The following setup was used in this study:

$B_o = 1.5T$ (GE Signa scanner)

RF sequence:
  X: 128 frequency encoded steps
  Y: 128 phase encoded steps
  Z: 16 phase encoded steps Te (echo time) = 3 msec (they used the first 2 echoes)
[Note: The present invention does not measure the FID signal emitted during the first 2 msec after excitation because about half of the MR visible IC sodium may have T2<2 msec and we are not interested in measuring the IC sodium concentration.]

T2 (spin-spin relaxation time) = 0.7 to 60 msec in vivo

TR (repetition time) = 98 msec

[Note: The repetition time used in this study limits the temporal resolution of this technique. As a result, this technique is inappropriate for the present invention since it will not be able to discriminated in time the early sensory components of the evoked potentials. This is even more disappointing since the generators of the earlier EP components are more focally localized than those of later components.]

TT (total imaging time) = 17 to 34 min

SR (spatial resolution) = 7 × 7 mm in plane and 10 mm slice thickness

From the results of this study it can be determined that the first echo gives more information about cortical concentration of sodium-23 than the subsequent echoes which in turn reveal better the CSF. Accordingly, the approach of the present invention is to collect only the first echo.

Hilal et al. used a technique similar to that of Winkler. See Hilal et al., "In Vivo NMR Imaging of Sodium-23 in the Human Head", *Journal of Computer Assisted Tomography*, 9:1-7 (1985). This study used the following experimental setup:

Bo = 1.5 T at 16.8 MHz with 9.25% MR sensitivity of $^{23}$Na compared to $^1$H.

Used spin-echo pulse sequence: averaged 3 echoes (12, 28.5, and 43.8 msec).

[Note the sodium MR signal measured during the 1st echo is 54,000 times smaller than the proton signal measured during the 1st echo.]

Detected only EC sodium (i.e. looked at about 40% of all sodium)

TR (repetition time) = 100 msec (compared to TR = 200 to 2,000 for $^1$H)

TT (total imaging time) = 34 min (vs 4 to 6 min for $^1$H)

Used total volume imaging method—3D-FT (vs multislice 2D-FT for $^1$H)

Used data matrix of size 32 × 32 = 24 (later improved to 64 × 64 × 24)

SR (spatial resolution) = 4 mm (vs 1mm for $^1$H)

Contrast sensitivity = 20 mM Na in disk of 4 mm diameter and 1 cm thickness

According to the above described and other studies relevant to the present invention, the fastest Na$^+$ MR acquisition time reported is TR = 98 msec [Winkler et al. 1990] and the best spatial resolution reported is 2.2 mm. See Hilal, S. Y,, Ra, J. B., Oh, C. H., Mun, I. K., Einstein, S. G., & Roschmann, P. (1987), "Sodium imaging," In D. D. Stark & W. G. Bradley (eds.), *Magnetic Resonance Imaging*. (pp.715-791). St. Louis: Mosby; and Ra, J. B., Hilal, S. K., & Oh, C. H. (1989), "An algorithm for MR imaging of the short T2 fraction of sodium using the FID signal," *Journal of Computer Assisted Tomography*, 13, 302-309. Also, these studies demonstrate that the predominance of the EC and plasma sodium compartments over the IC compartment, the invisibility of part of the IC compartment, and the difficulty in imaging the very fast T2 component of the visible intracellular sodium, make the usual $^{23}$Na spin-echo image essentially an image of the EC and plasma space.

A number of physiologically related issues must be considered with respect to the present invention. One of them is the fact that sodium has approximately the same T2 in blood plasma as in the EC space (15-30 msec). Therefore, it is of significance that these two compartments are characterized by two causally related processes which have opposite effects on the [Na$^+$]$_e$ at a site of activation. Specifically, increase in neuronal activity is usually followed by an increase in regional Cerebral Blood Flow (rCBF). However, increase in neuronal activity leads to a decrease in [Na$^+$]$_e$ due to the movement of sodium intracellularly. As a result, the MR signal decreases. On the other hand, the increase in cerebral blood flow and hence intravascular plasma leads to an increase in [Na$^+$]$_e$ which results in an increase in MR signal intensity. (Notice that the blood flow effect is smaller since the plasma sodium is responsible only for about 18% of the total MR signal whereas the interstitial sodium is responsible for about 71% of the total signal [see Winkler et al. 1990]). Therefore, the choice of temporal resolution (reflected in the TR) is of particular importance for resolving these two effects. With poor temporal resolution the two effects will tend to cancel each other which will reduce the overall MR signal in the area. On the other hand, with sufficient temporal resolution, when a cortical region is activated we expect to observe: (1) an initial drop in the sodium MR signal (due to influx of Na$^+$ in the neurons where it becomes invisible): (2) followed by an increase of the MR signal due to an increase of rCBF in the region. These opposite effects will result in an increased value of the first derivative of the signal which will enhance the visualization of the sequence of neuronal activation. Another possible way to separate the two processes is by separately estimating the increment of signal intensity due to an increased blood flow to the area. This can be done by having a marker or tracer in the blood that could be measured with a proton-based pulse sequence. For instance, with circulating gadolinium or other agents one could get an estimate of the increment in local cerebral blood volume (i.e. the intravascular component rather than the diffusion component) and assess that component of the cancellation effect. Subtracting this estimate from the total MR signal can give us the decrement in signal intensity due to the movement of sodium from extra to the intracellular space.

CURRENT APPLICATIONS OF $^{23}$Na MRI

During the past 5-6 years $^{23}$Na MRI has been used mostly for clinical purposes as an alternative or complement to other imaging techniques. Hilal et al. studied the extent and grade of supratemporal tumors (mitotic activity); cytotoxic cerebral edema; stroke; and cerebral infarctions. See Hilal et al., "In Vivo NMR Imaging of Sodium-23 in the Human Head". *Journal of Computer Assisted Tomography*, 9(1):1-7 (1985). Winkler et al. measured cerebral blood flow and interstitial volume. See Winkler et al., "Sodium-23 Magnetic Resonance Brain Imaging", *Neuroradiology*, 32:416-420 (1990). Cameron et al. measured mitogenesis and oncogenesis. See Cameron et al., "Intracellular Concentration of Sodium and Other Elements as Related to Mitogenesis and Oncogenesis In Vivo", *Cancer Research*, 40:1493-1500 (1980).

To the present inventor's knowledge, to date there has not been a published paper which reports or suggests the usage of $^{23}$Na-MRI for measurement of current flow in the brain. A proton MRI technique has been proposed to measure neuronal activity. See U.S. Pat. No. 4,719,425, which discloses a technique which combines electron spin resonance (ESR) with proton MRI to measure neuronal activity. Unfortunately, this technique has a limited temporal resolution and further, generates a proton MRI which will not reveal neuronal activity to the extent that a sodium MRI will in accordance with the teachings of the present invention.

Some plausible reasons for the rejection of $^{23}$Na MRI by other investigators may include: (a) The common electrophysiological texts claim that changes in Na$^+$ concentration during neuronal activity are negligible. For example, see Kandel and Schwartz (Eds.), *Principles of Neural Science,* (pp. 58-65) New York, N.Y.: Elsevier Science Publishers (1985). (b) A priori estimates of the MR signal strength that might be generated by the rapid change of extracellular Na+ concentration in a voxel (which is the basis of the sodium transmembrane currents) could suggest that this signal would be too small to measure. (c) Limitations on the scanning speed of the sodium scanners suggest an insufficient sampling rate to effectively monitor neuronal activity.

With the techniques of the present invention, the three above mentioned objections to the development of such a method can be overcome. In particular: (a) The Na+ concentration changes referred to in the common literature concern only sodium in the EC space surrounding axons and produced by Action Potential propagation along these axons. While the quoted magnitudes of change in this case are adequate, they by no means apply to the changes of sodium around the dendritic trees due to synaptic communications. Calculations presented below suggest significant changes. (b) The weak MR signal can be improved by signal averaging. Therefore, the present invention is primarily directed to "evoked" sodium MRI rather than "continuous" sodium MRI (consider EP vs. EEG). (c) Adequate temporal resolution with sodium MRI can be achieved by using driven-equilibrium pulse technique. See van Uijen et al., "Driven Equilibrium Radiofrequency Pulses in NMR Imaging", *Magnetic Resonance in Medicine,* 1:502-507 (1984); and Lufkin, "Magnetic Resonance Image Formation," in R. B. Lufkin (Ed.), *The MRI Manual,* (pp. 42-79), Chicago, Ill.: Yearbook Medical Publishers (1990), which are both herein incorporated by reference. This method achieves high MR scanning rates (short TR) by significantly speeding up the otherwise slowly relaxing nuclear magnetizations.

PRINCIPLES OF OPERATION OF EVOKED SODIUM MRI

The proposed method makes use of conventional $^{23}$Na MRI instruments for the basic hardware platform. The scanner is coupled with appropriate data acquisition and post-processing routines to measure changes in $[Na^+]_e$ during neuronal activation. The invention distinguishes $[Na^+]_e$ from $[Na^+]_i$ on the basis of different T2s for these compartments ($T2_i < T2_e$). See Perman et al., "Methodology of In Vivo Human Sodium NMR Imaging at 1.5 Tesla", *Radiology,* 160:811-820 (1986). Notice that the present invention does not use chemical shift reagents (e.g., intrathecal dysprosium or super paramagnetic iron oxide coupled to dextrant) to identify the plasma compartment as reported in the literature, since most of them, due to their toxicity, are not suitable for in vivo measurements.

Also, it is important to note that within a voxel of practical size (e.g., $10 \times 10 \times 10$ mm) the intracellular and extra-cellular compartments are interleaved within the same physical space. In the vertebrate, the fraction of a brain region that is extra-cellular (often called "volume fraction") is typically about 20-30%. The present technique does not attempt to measure ionic flows into and out of a voxel. In other words, it does not measure the flow of ions from one region of the EC space to another (a process called "spatial buffer mechanism"). Instead, the present invention mostly measures the flow of ions from the extra-cellular compartment into the intracellular compartment (and vice versa) which takes place within the same voxel. The change of charge ($[Na^+]_e$) in a given voxel of brain tissue during consecutive time intervals (bins with duration TR of 30 to 50 msec) is measured with respect to its previous value or with respect to a baseline (a resting steady state sodium concentration). Therefore, the series of 3-D images, which this invention generates, provide a dynamic view of the EC sodium current flow in the brain.

Referring now to FIG. 1, a gray-scale view of expected output of the evoked sodium MRI method is shown. The figure shows a time sequence of four 3-D, surface-rendered composit MRI images ($^{23}$Na MRI superimposed on 1H MRI) in which the skull is removed and the brain surface is exposed. Each image shows the values and localization of averaged extracellular sodium concentration within a particular time window after the stimulus onset (Frame#1: 0-40 msec; Frame#2: 40-80 msec; Frame#3: 80-120 msec; Frame#4: 120-160 msec). The values of the extracellular sodium concentration are shown using gray-scale gradients: reduced concentrations of sodium are shown by brightening the proton MRI image whereas increased concentrations are shown darker. The changes of the sodium concentration across images are associated with interneuronal signaling evoked by repeated stimulation with a checkerboard pattern reversal with a reversal rate of 2 cycles/sec. The corresponding cortical generator areas of the most prominent positive and negative peaks in the VEP are labeled (N70, P97, N97, P145 and N160). Animation of these images reveals the sequence of activation of various brain areas during the stimulus processing, thus, providing a visualization of the information flow in the brain. Notice that while these images reveal the sodium concentrations only as it appears on the cortical surface, the data set obtained by the evoked sodium MRI (ESMRI) method of the present invention can be processed in such a way (e.g., by means of volume rendering and slicing at arbitrary angles) that the sodium concentration in any location inside the brain can also be visualized.

GENERAL DATA ACQUISITION PROTOCOL

The data sampling protocol chosen for the present invention will generally be a tradeoff between the spatial and temporal constraints of the electrical activity in the brain, and the technical (quantum-mechanical and biochemical) constraints of the $^{23}$Na MR imaging technique.

Figure 2:
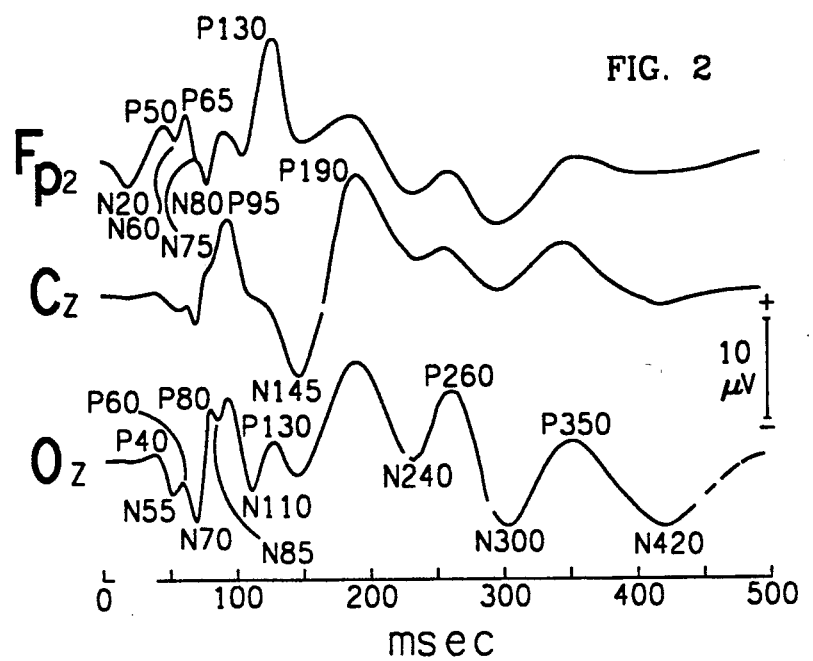
FIG. 2 is a graph containing three curves of human visual evoked potentials (VEP) evoked by flash stimulus, measured with an EP apparatus.

The frequency components of typical visual evoked potentials (VEP) and auditory evoked potentials (AEP) can be used to determine the minimal rate of the data sampling. Referring to FIG. 2, a schematic summary of typical visual evoked potentials (VEP) recorded in a normal, awake, adult subject not performing a specific task are shown. The response is to an unpatterned, centrally fixated flash, recorded with reference to an ear. Amplitude calibration is approximate. Components are not necessarily largest at the locations shown. The frontal location of P130 (positivity observed about 130 msec after the flash) is myogenic; all other components are thought to be neurogenic. The curves represent averaged recordings from three different locations on the scalp labeled according to the International 10-20 System for EEG Electrode Placement. Namely, the FP2 electrode is located over the right frontal polar area; $C_z$ is at the midline over the junction of the frontal and parietal lobes; and $O_z$ is located at the midline over the occipital lobe.

Figure 3:
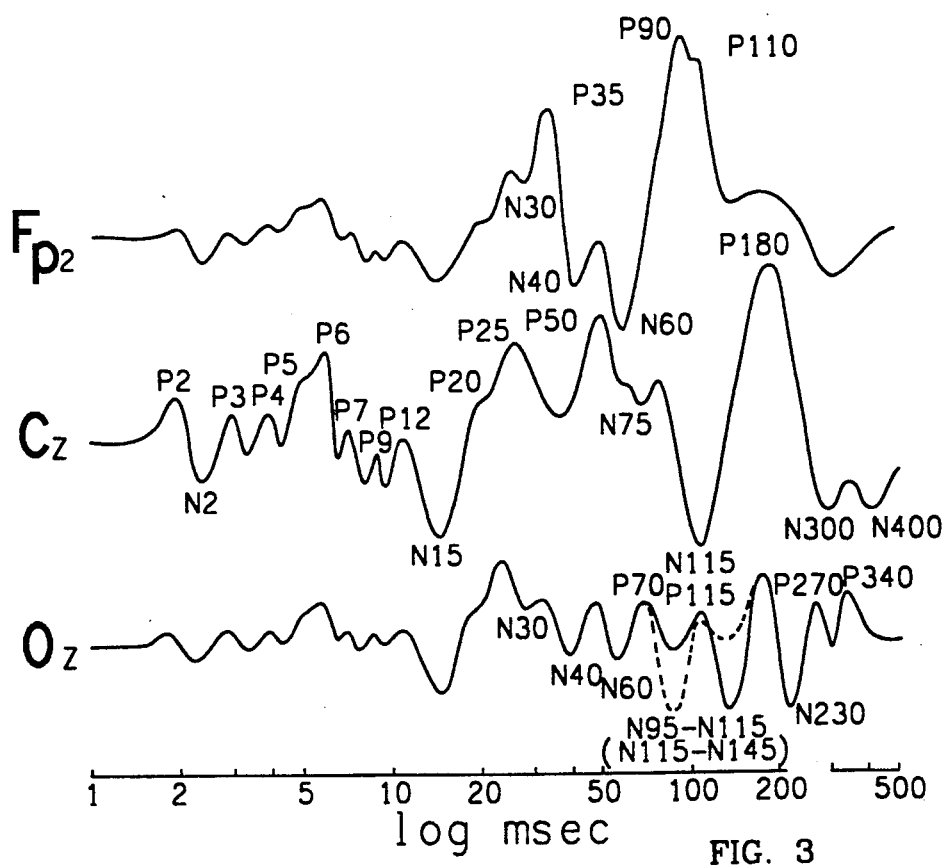
FIG. 3 is a graph containing three curves of human auditory evoked potentials (AEP) in response to click stimulus, measured with an EP apparatus.

FIG. 3 is a schematic summary of typical human auditory evoked potentials (AEP) recorded in a normal, awake, adult subject not performing a specific task in relation to a stimulus. The stimulus comprises brief tone bursts. No amplitude calibration is shown since the P2-P9 complex is much smaller (typically 0.1 to 0.15 $\mu V$) than later components (typically 1 to 20 $\mu V$). For purposes of illustration the peaks are not drawn to the same amplitude scale. Note that the time scale is in log msec to allow visualization of very short latency components. Components are not necessarily largest at the locations shown. Components N15, P20, N30, P35, a portion of N40, a portion of N60, N75, N90 and P110 are thought to be myogenic; all other components are thought to be neurogenic.

From FIGS. 2 and 3 it is evident that the highest frequencies of the neurogenic components are about 20 Hz (50 msec). Therefore, to be able to discriminate these frequency components in the evoked sodium MRI of the present invention, we need to sample at a frequency at least equal to, or faster than, the fastest frequency component.

It should be noted that the sampling rate is also limited by the nuclear dynamics of the $^{23}Na$ MRI. In the present invention we are primarily interested in the first echo which best reveals the EC $Na^+$ concentration. Note that the Free Induction Decay (FID) signal measures mostly the intracellular concentration while the second echo measures mostly the plasma and cerebral spinal fluid (CSF) concentration. By measuring specifically the EC concentration and not the IC concentration, the present invention is able to capture fast local changes of this concentration which reflect the extracellular sodium currents.

Figure 5:
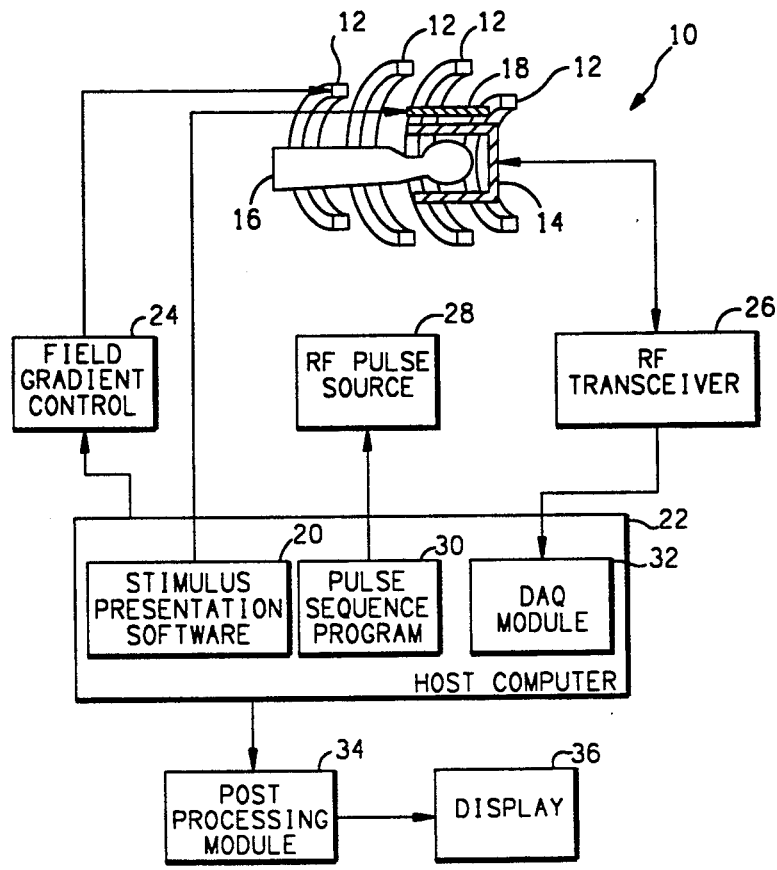
FIG. 5 is a diagram of a MRI apparatus for measuring sodium currents in the brain in accordance with the present invention.

The overall Evoked Sodium MRI (ESMRI) system 10 in accordance with one embodiment of the present invention is shown in FIG. 5. The system 10 includes a set of main field coils 12 and a 17 MHz NMR RF coil 14. The main and RF coils 12, 14 may be conventional MRI coils such as those found in the MAGNETOM 63 SP/HELICON Whole Body MR Imaging System manufactured by Siemens Medical Systems, Inc. of Iselin, N.J. While this system is provided with a linear RF coil in accordance with a preferred embodiment of the present invention a quadrature coil may be used, to provide the advantages for imaging sodium. For the purpose of sodium imaging this system provides special sequences including: (a) Spin echo sequences with TR minimum of 40 msec and TE minimum of 12 msec, and: (b) Gradient echo sequences with TR minimum of 20 msec and TE minimum 8 msec. (For the purpose of the present invention, these sequences are modified as described further (see FIG. 7).) The available matrix sizes in this system are 32, 64 and 128 (squared and with oversampling). The main field coils 12 include X, Y and Z gradient coils, which are under individual control by a gradient control module 24., which is in turn controlled by the host computer 22.

The patient or subject 16 is placed within both magnetic and RF coils 12 and 14. A stimulus presentation module 18 is connected to stimulus presentation software 20 within a host computer 22. The stimulus presentation module 18 may present various kinds of visual, auditory or other types of stimulation to the subject 16 as described below. The stimulus presentation software 20 controls the stimulus presentation hardware module 18 to provide the particular stimulus parameters required. The host computer 22 is a minicomputer; in the preferred embodiment, a Digital Equipment Corporation (of Mainart, Mass.) Micro-VAX 11 is employed. As used hereinafter, the X-Y plane is defined as the plane passing through the subject laterally, and the Z direction is defined as the longitudinal axis (from head to toe) through the subject.

The NMR RF coil 14 is controlled by an RF transceiver system 26 which provides the necessary control signals and power to the RF coil 14 to generate desired RF signals to the subject, as described in more detail below. This aspect of the RF transceiver system 26 functioning is controlled by a pulsed RF source module 28 which in turn is under control of a pulse sequence program 30 in the host computer 22. The RF source module 28 provides the needed control signals to ensure that the resulting excitation pulse is of the correct phase, frequency and frequency bandwidth to excite nuclear spins only in a predetermined slice (e.g., in the X-Y plane) of the subject 16 being imaged. In addition to transmitting the required RF pulse, the RF transceiver system 26 and RF coil 14 also perform the function of sensing nuclear RF emissions from the subject in accordance with the above-described NMR phenomena. In particular, the RF emissions are sensed by the RF coil 14 and a signal is processed by the RF transceiver system 26 and transmitted to the host computer 22 where it is further processed by the data acquisition software 32.

It will be appreciated that conventional MRI scanners such as the above-described Siemens system will contain the necessary hardware such as the main coils 12 NMR RF coil 14, field gradient control module 24, RF transceiver system 26, and pulsed RF source 28. However, the stimulus presentation software 20, the data acquisition software 32 and pulse sequence program 30 in the host computer 22 will necessarily be adapted in accordance with the teachings of the present invention. It is an important advantage of the present invention that conventional hardware is primarily used to implement its methods. Thus, by minimizing the need for special purpose hardware the cost to implement the present invention on a widespread basis is thereby greatly reduced.

A post-processing module 34 performs such functions as MR signal optimization and derivation of sodium currents. A display unit 36 provides for three-dimensional visualization of the measured sodium currents. To achieve improved localization of these currents the display of the sodium currents is superimposed over a 3-D proton MRI image of the same brain. The proton MR image is acquired in the same scanner (the sodium RF coil is substituted by a proton RF coil) before or after the acquisition of the set of sodium images.

Figure 6:
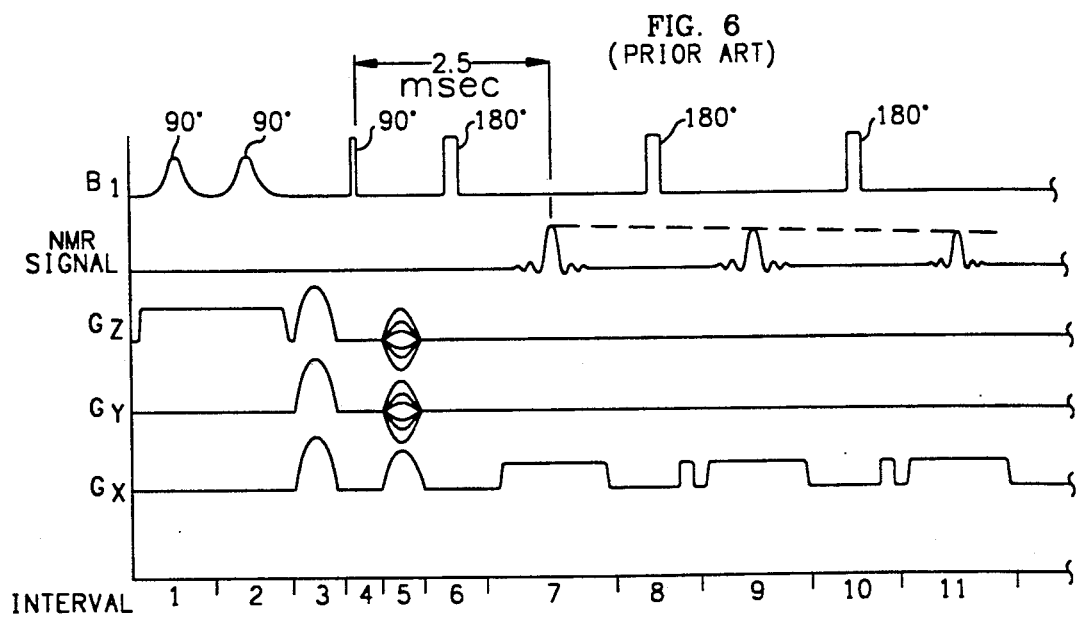
FIG. 6 is a diagram of the data acquisition protocol for sodium MR imaging in accordance with the prior art.

Referring now to FIG. 6, a data acquisition protocol in accordance with the prior art is shown. This data acquisition protocol is from a short echo NMR sodium imaging technique, described in U.S. Pat. No. 4,803,432 which is herein incorporated by reference. The pulse sequence in FIG. 6 is suitable for imaging nuclei having a very short T2 relaxation constant such as sodium. The first three of the 11 intervals shown on the time axis (defined by the numbered regions on the bottom line) of this pulse sequence perform a presaturation of all resident nuclei positioned outside a selected slice (in the X-Y plane) of the subject's 16 brain. The selective 90° RF pulses applied in intervals 1 and 2 have frequencies and bandwidth such that nuclei lying on one and the other sides of the slice, respectively, are saturated. The magnetic gradients shown in curves $G_z$, $G_y$ and $G_x$ during the third interval are strong magnetic field gradients applied along all three axes to dephase the precessing nuclei. As a result, the resident nuclei on each side of the slice cannot produce an MRI signal of sufficient magnitude during the subsequent intervals of the pulse sequence.

During interval 4 a nonselective 90° RF excitation pulse is produced which tips all sodium nuclei within the RF coil 90° to produce a maximum amplitude NMR signal. Following this, phase encoding gradient pulses $G_z$ and $G_y$ are applied during interval 5, as well as a dephasing lobe of the frequency encoding gradient field $G_x$. The frequency encoding gradient field $G_x$ is applied during each of the subsequent intervals during which an echo NMR signal is produced.

During interval 6 a nonselective 180° RF echo pulse is produced to invert the magnetization and cause an RF echo to form. This produces an echo NMR signal during interval 7 which is acquired for a 1 msec time interval. In order to quantify both the long and short T2 components of in vivo sodium, a total of 8 nonselective 180° RF pulses are produced during the pulse sequence time such that the first four NMR echo signals which result are spaced at 2.5 msec intervals and the last four are spaced at 5 msec intervals. Trim pulses in the readout gradient $G_x$ are produced prior to the second and subsequent NMR echo signals, as indicated in intervals 8 and 10. These ensure that the gradient echo is produced in coincidence with the "Hahn" echo despite eddy currents in the subject.

It should be noted that in the description of the prior art technique shown in FIG. 6 (U.S. Pat. No. 4,803,432) there is no suggestion that it be used to measure neuronal activity in the brain. One problem with the technique disclosed in FIG. 6, if it were to be used for measuring neuronal activity in the brain, is that it uses very long TR (100 msec) which is not sufficient to achieve the temporal resolution necessary for discrimination of the sequence of activation of brain structures. Another problem with the technique is the lack of sufficient time averaging which is necessary for obtaining a significant SNR.

Figure 7:
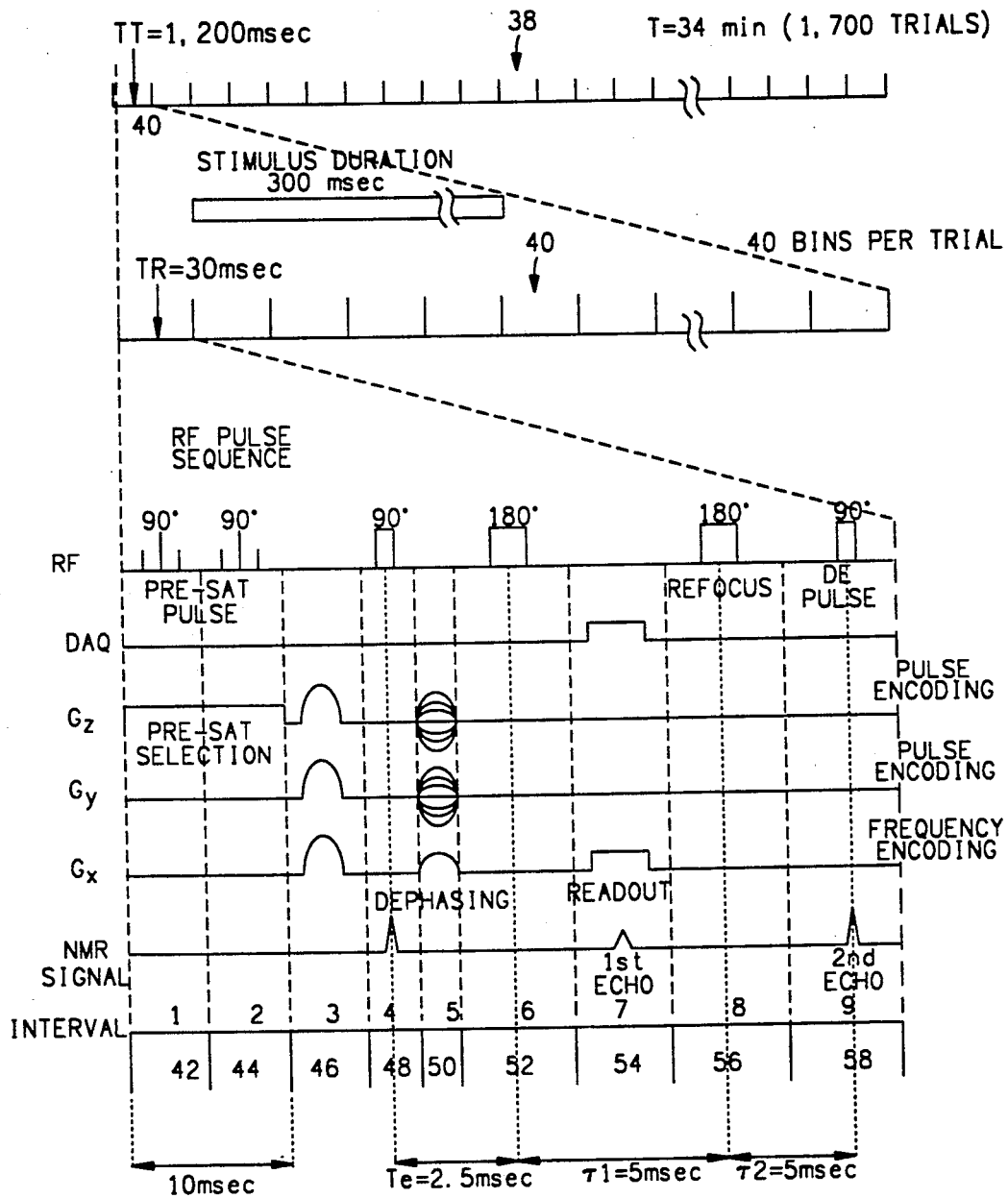
FIG. 7 is a diagram of the data acquisition protocol for evoked sodium MRI in accordance with the one embodiment of the present invention.

In accordance with the present invention, a data acquisition protocol, including signal averaging, image sequence formation, and RF pulse sequence of a first preferred embodiment of the present invention is shown in FIG. 7. To increase the signal to noise ratio (SNR) a relatively long total imaging time T is shown in FIG. 7 to be 34 minutes. This allows for acquisition of 1,700 individual trials 38 with duration (trial time) TT=1,200 msec each. Depending on the dynamics of the task which the subject performs (i.e. its modality, complexity, familiarity, etc.) the duration of each bin 40 (also called TR—repetition time) may vary between 30 and 50 msec (30 msec in this embodiment). The number of trials may vary from hundreds to tens of thousands. As a result, the total imaging time T may vary between 30 to 60 minutes. It is conceivable that during such a period of time the subject might get bored or tired of performing the same task over and over again. In such situations it is desirable and technically possible to divide the total number of trials in several consecutive groups and give the subject time to rest between the groups.

The magnetic resonance data acquisition function controlled by the data acquisition software 32 is time-locked and triggered by the stimulus presentation module 18 under control of the stimulus presentation software 20. The collected magnetic resonance data during each trial is sorted in several bins such as 40 in this embodiment shown in FIG. 7. Each bin contains a complete 3-D data set and is acquired within one TR (repetition time). A sufficiently short repetition time (50 msec or less) is achieved by means of a Driven Equilibrium Fourier Transform (DEFT) described in more detail below. The stimulus is presented once during each trial and its onset is time-locked with the beginning of the second bin. Therefore, the image acquired during the first bin is that of the sodium concentration distribution in the brain during resting state. The duration of the stimulus (300 msec in this embodiment) is chosen such that it produces large and sustained evoked potentials and hence correspondingly large sodium currents. The 40 bins in which the data of each trail is partitioned provide a sequence of 40 images (frames) of neuronal activity which occurs before, during and after the stimulus presentation. Corresponding bins in each of the 1,700 trials are then averaged to provide improved signal to noise ratio.

Depending on the type of MR scanner used and specifically on the image formation algorithm, the data acquisition protocol may require certain modifications. For scanners which can acquire a completely resolved data set (i.e. caring information about all 3-D coordinates) during each TR (such as planar echo sequence), the technique may be used as described without modifications. For scanners which can acquire only one slice per TR (gradient echo algorithms), the technique must be modified such that the acquisition of various bins (of the evoked signal) is interleaved with the stimulus presentation so that ultimately a complete 3-D data set for each stimulus is acquired and all such data sets are averaged together to produce tie evoked MR image sequence.

In the case of sodium imaging where noise is the limiting factor, a total volume 3-D imaging approach appears to be the most desirable, without much to be gained by limiting the number of observed slices. See Hilal, S. K. Maudsley, A. A., Ra, J. B., Simo, H. E., Roschmann, P., Wittekoek, S., Cho. Z. H., & un, S. K. (1985), "In Vivo NMR Imaging of Sodium-23 in the Human Head", *Journal of Computer Assisted Tomography*, 9, 1-7, which is herein incorporated by reference. Compared with the multislice technique, the 3-D scheme maximizes the signal to noise ratio of the final images. See J. B. Ra, et al., "An Algorithm for MR Imaging of Short T2 Fraction of Sodium Using the FID Signal", *Journal of Computer Assisted Tomography*, 13(2):302-309 (1989), which is herein incorporated by reference.

Referring now to the RF pulse sequence shown in FIG. 7 in more detail, the first line labeled RF corresponds to the first line of the prior art pulse sequence discussed above in connection with FIG. 6. The DAQ line is the data acquisition line which shows when the signal is being measured and acquired by data acquisition module 32. $G_z$ $G_y$ and $G_x$ represent the magnetic gradients on the main field coils 12 in the Z, Y and X directions, respectively. It will be appreciated that the $G_z$, $G_y$ and $G_x$ lines represent magnetic gradients that are provided on top of the main magnetic field and that their purpose is to encode which point or which location in the 3-D volume a particular NMR signal is coming from. That is, since the nuclear magnetic spin frequencies depend on the strength of the magnetic field, the space in the brain is encoded by magnetic field gradients to pinpoint where in space an NMR signal of a particular frequency is coming from. The main magnetic field in a preferred embodiment is 1.5 Tesla.

In the first interval 42 a presaturation pulse is transmitted as shown on the RF line. This pulse presaturates all resonating nuclei located on one side of the currently imaged slice as selected by the G. gradient which is also introduced during this interval.

In the second interval 44 an additional presaturation pulse is introduced which has a center frequency and bandwidth chosen such that now the resonating nuclei on the other side of the selected slice are presaturated.

In the third interval 46 magnetic field gradients are applied along all three axes to dephase the precessing nuclei as described above in connection with FIG. 6. This results in regions on either side of the desired slice which are unable to produce an NMR signal of sufficient magnitude during the subsequent intervals of the pulse sequence.

During the fourth interval 48, a nonselective 90° RF excitation pulse is produced by the RF coil which tips all sodium nuclei within the selected slice causing them to begin precessing around the main magnetic field. The 90° RF pulse has a frequency of 16.9 MHz and a duration of 0.21 msec.

During the fifth interval 50 phase encoding gradient pulses $G_z$ and $G_y$ are applied as well as a dephasing lobe of the frequency encoding gradient field $G_x$. The purpose of these fields is to encode spatial information in direction of the gradients.

In the sixth interval 52 a nonselective 180° RF pulse is transmitted which inverts the magnetization and causes an RF echo to form.

During the seventh interval 54 a frequency encoding gradient field $G_x$ is applied (data acquisition) and the echo RF signal is acquired. The time interval between the application of the RF echo pulse and the production of the echo is known as the echo time Te which in this embodiment is equal to 2.5 msec. The 180° RF pulse has a frequency of 16.9 MHz and a duration of 0.42 msec.

It should be noted that up to this point the pulse sequence used in the present invention closely parallels the pulse sequence described in the prior art shown on FIG. 6. From this point on, however, we incorporate in our sequence several steps of the Driven Equilibrium Fourier Transform procedure described in the above discussed reference by van Uijen et al. The purpose of incorporating this technique in the present invention is to reduce the repetition rate by forcing the total transverse magnetization toward the direction of the main static magnetic field Bo after the MR signal acquisition is completed.

During the eighth interval 56 a 180° spin-echo pulse is used to refocus the transverse nuclear magnetizations so that they can be later easily reoriented by a resonant RF pulse to the equilibrium direction. The spin-echo pulse generates a second echo and gradients are applied so that at the point of this echo dephasing effects due to previously applied gradients cancel. In the prefered embodiment the time interval $\tau 1$ between the two 180° pulses is 5 msec.

In the ninth interval 58 a 90° selective pulse (called driven-equilibrium pulse) is used to drive the system back into equilibrium to decrease the time before the next TR begins. The time interval $\tau 2$ between the second 180° RF pulse and the driven-equilibrium pulse is 2.5 msec in the preferred embodiment.

Figure 4:
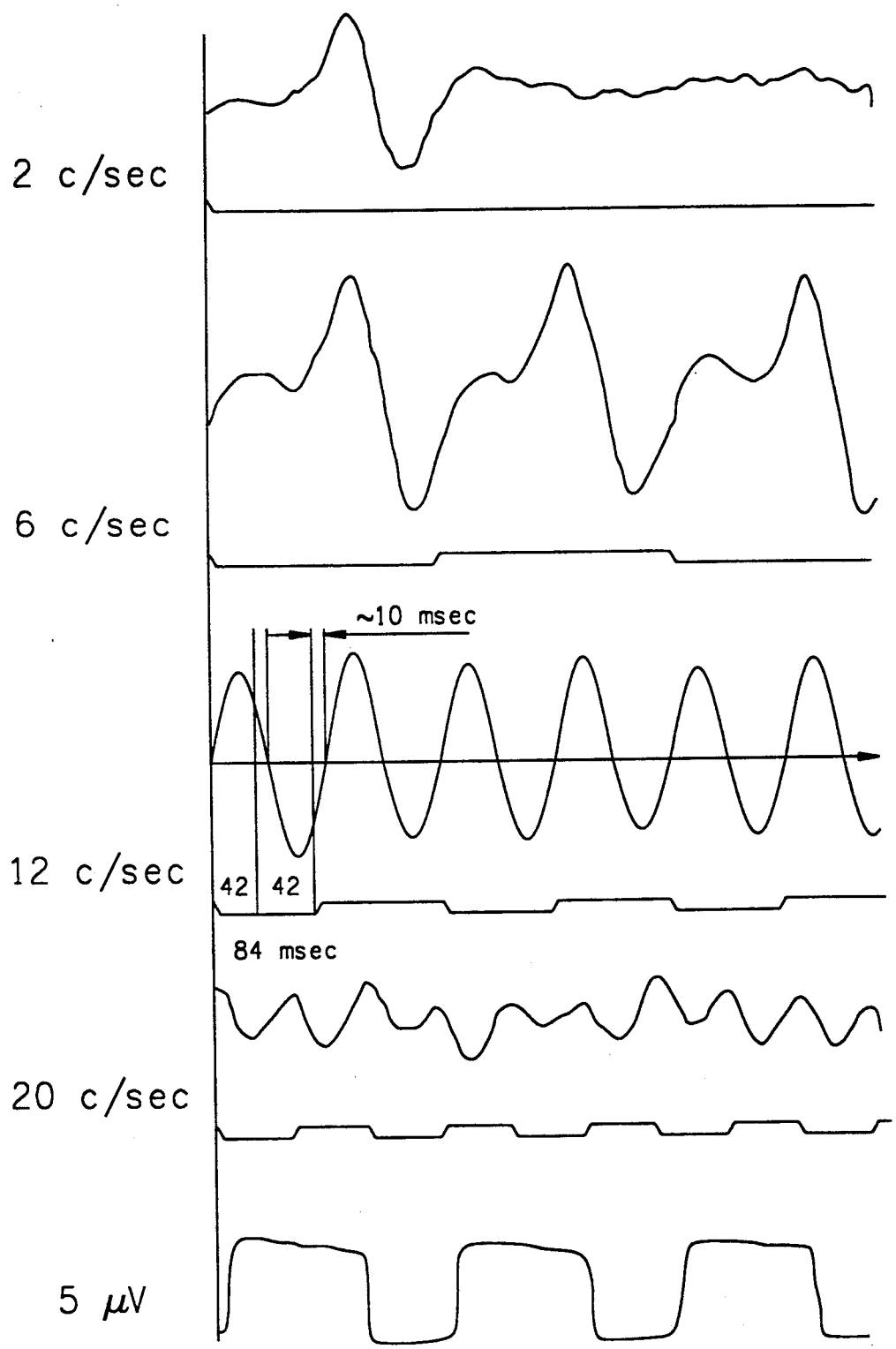
FIG. 4 is a set of curves depicting visual evoked potentials evoked by checkerboard pattern reversal measured with an EP apparatus.
Figure 8:
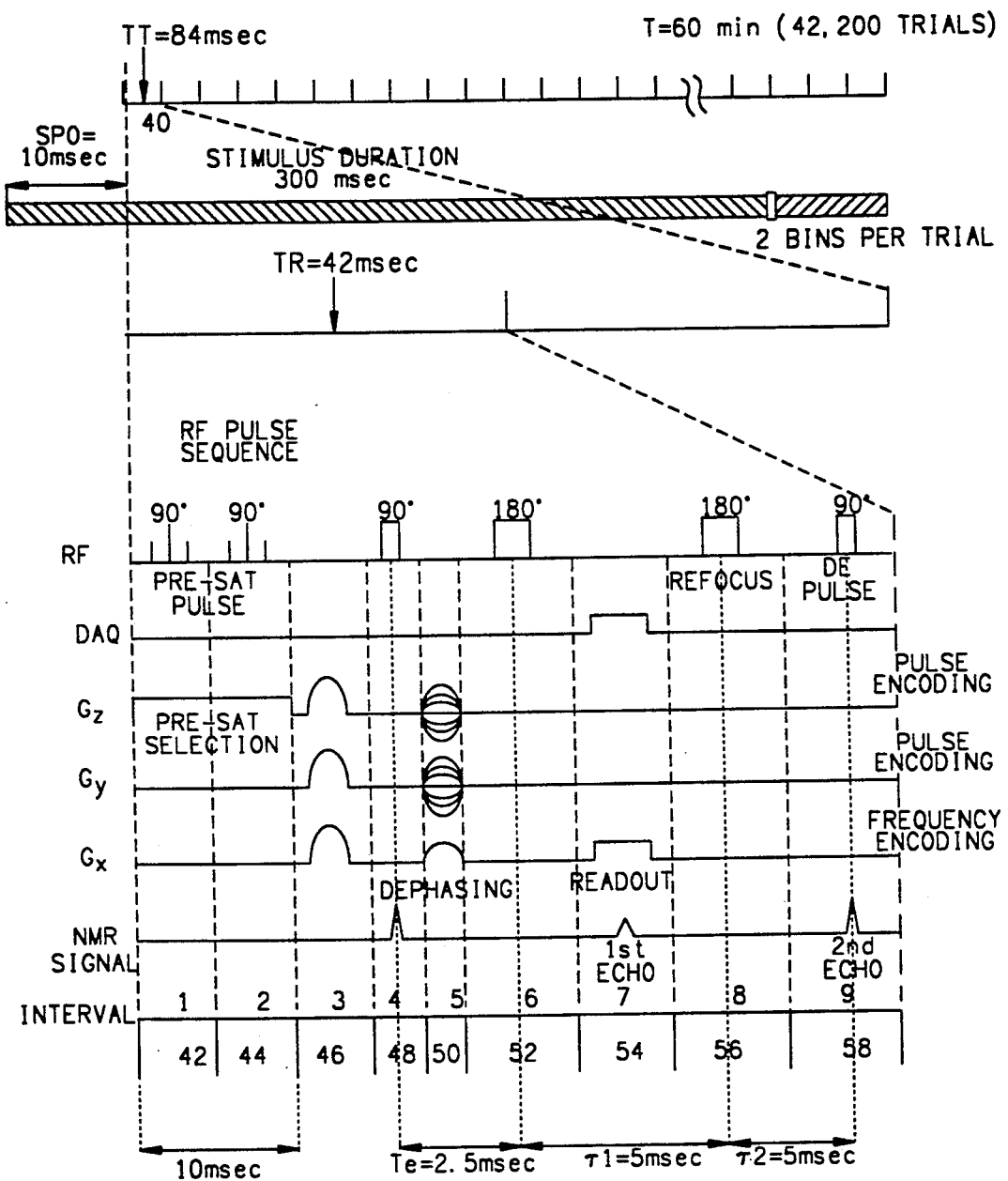
FIG. 8 is a diagram of the data acquisition protocol for evoked sodium MRI in accordance with another embodiment of the present invention.

For further details of the Driven Equilibrium Fourier Transform see U.S. Pat. No. 4,527,124 which is hereby incorporated by reference as well as the above discussed articles by van Uijen et al. In another preferred embodiment of the present invention a stimulation paradigm is designed for obtaining a maximal MR signal-to-noise ratio. Referring now to FIG. 8, a data acquisition protocol is shown which employs 43,200 trials, each of duration 84 msec over a period of 60 minutes. Each trial comprises two bins (images) of duration (TR) 42 msec each. The stimulus is a visual pattern—a checkerboard (each checker is 15' in arc). The pattern is reversed at a rate of 12 Hz. This type of stimulation has been shown to evoke large periodic sinusoidal visual evoked potentials (VEPs). For example, see FIG. 4 which shows averaged VEP traces of 500 msec duration in response to abrupt up and down movements of a checkerboard pattern through exactly one square width shown at various frequencies. Each trace is an average of 128 responses. The calibration line under each trace indicates the abrupt reversal. Note that each movement generates an identical response. The 12 Hz stimulation is especially suitable for studying evoked sodium MRI since within each 84 msec long interstimulus interval (ISI) the response waveform contains a distinct positive wave followed by a symmetric negative wave both of about 42 msec duration. The frequency of the visual evoked potentials is twice the frequency of the stimulus. At 12 Hertz the ISI is 84 msec. In the embodiment shown in FIG. 8, this 84 millisecond interval split into two bins (42 msec each) where each bin corresponds to one TR. It is important that the phase lag of each bin with respect to the stimulus onset is chosen such that the value of the signal collected in each bin is maximized. Ideally the first bin will collect the signal corresponding to the positive phase of the Evoked Potential (EP) waveform, whereas the second bin will collect the signal corresponding to the negative phase.

In accordance with an additional embodiment of the present invention a different visual stimulation is applied to measure more than two states of the sodium concentration. In this embodiment the checkerboard pattern is reversed at a reversal rate of 7 Hertz. Continuous stimulation of this type results in a more complex (biphasic EP waveform). In this case, during the 142 msec ISI three bins of information are collected. This allows the observation of a very rudimentary three frame long cine of sodium currents. In yet another embodiment of the present invention, face recognition is used as a stimulus. The subject is shown a series of faces some of which are familiar and the rest of which are novel and is asked to press a button in response to familiar faces.

The ESMRI technique of the present invention is designed primarily for auditory, visual, and somatosensory stimulation. Delivering these stimuli to the subject (by means of the stimulus presentation hardware 18) which is in a supine position in the scanner, poses some technical difficulties. To overcome these problems, specially designed devices may be employed. For example, the auditory stimulation can be delivered by frequency attenuation compensated pneumatic headphone and liquid tube, (see U.S. Pat. No. 4,701,952). An additional consideration is the MRI device generated sounds (during the switching of gradient fields) which can evoke additional undesirable auditory potentials. One way to reduce this factor is the use of ear plugs or specially designed noise reduction techniques. The visual stimulation can be delivered via "anti-claustrophobic glasses", (see U.S. Pat. No. 4,804,261) which allow the subject to see out of the scanner over the head or feet to scenes placed at a distant surface. Notice that the field of view and the luminance need to be chosen such that the maximal stimulation effect is achieved. Another option is to use special goggles with built-in array of LEDs.

Postprocessing of the magnetic resonance data in module 34 involves signal optimization and derivation of sodium currents. For signal optimization during reconstruction, groups of consecutive bins of various lengths can be summed to find an optimal signal to noise ratio. The simplest way for derivation of sodium currents is by means of image subtraction. Each image (bin) in the sequence will be subtracted from the next image in the sequence. This procedure produces a derivative of the sequence of images which effectively represents the sodium current flow. Another possibility is to subtract a common background acquired during an inactive (resting) state from all images in the sequence. More sophisticated postprocessing of the sequence of images is also possible.

Visualization of the sodium currents flow is performed by the display unit 36. It should be noted that the spatial resolution of the sodium data will be worse than that of proton data. Since we are interested in displaying sodium data from which a baseline has been subtracted (which in general carries information about the static distribution of sodium), most of the information about the brain localization of the observed sodium currents will be lost. To remedy this situation, along with acquisition of sodium data, a proton MRI may also be acquired in the same head position of the subject. Later, during visualization, the sequence of 3-D sodium MRIs can be superimposed on the 3-D proton MRIS. The proton MRIs can also be made semitransparent to allow the visualization of current flows. Another advantage of having a 3-D data set is that the view angle can be rotated during visualization to facilitate the viewer's perception of where the sodium currents flow.

THEORETICAL ASSESSMENT OF SODIUM CHANGES DURING ACTIVATION

An important consideration in measuring neural activity with the techniques of the present invention is the signal-to-noise ratio which is achieved. A theoretical analysis of the magnitude of sodium currents versus noise will be presented, followed by some approaches for optimizing the signal to noise ratio based on these considerations.

The measured sodium signal, as it was described above, is due to changes (decrease) of the extra-cellular concentration of sodium associated with interneuronal signaling. More specifically, excitatory post synaptic potentials (EPSPs) triggered by action potentials impinging upon the dendritic trees result in Na+ influx into the dendritic trees of the postsynaptic cells. Note that the generation of inhibitory postsynaptic potentials (IPSPs) does not result in large sodium influx since in this case the main current carriers are K+ and Cl− ions. However, it is possible that there would be a slight increase in extracellular sodium concentration with strong inhibition in a given site which can be detected by the present method as increase in the MR signal. This is important since many if not most operations in the central nervous system are inhibitory. Excitation may merely result from a release of inhibition. The noise (background) in the MR signal is produced by the IC and EC sodium ions.

Below is a rough estimate of the concentration change within a 1 mm$^3$ volume of cerebral cortex (e.g., primary visual cortex—V1). From neuroanatomical studies it is known that the pyramidal cells in the V1 are activated by direct projections of neurons in the Lateral Geniculate Nucleus (LGN) and by back projections from higher visual cortices (V2, V3, etc.). Also, they are activated by intra-volumenar (local) neuronal projections.

Two basic factors are involved in the sodium concentration decrease in the EC space during neuronal activity:

(1) Action Potential (AP) generation by the neurons within the voxel in response to synaptic activation. APs produce sodium sinks in the somas and the proximal dendrites as well as along the axons.

(2) Synaptic activation due to impinging APs carried by axons that project to neurons within the voxel as well as by axons of local area neurons which lead to the generation of EPSPs. These EPSPs in turn are associated with sodium sinks in the dendritic trees.

For the present analysis we use data from various published sources. In cases when the values of a particular experimental parameter vary within a range, we assume the more conservative estimate for our calculations.

Average number of pyramidal cells per mm$^3$ in human visual cortex: $\approx 10^4$ cells.

Average surface area of a neuronal dendritic tree and cell body: 11,000 to 97,000 $\mu m^2$. We assume $5 \times 10^4$ $\mu m^2 = 5 \times 10^{-2}$ mm$^2$.

[Note: The dendritic surface is 5 times larger than that of the perikaryon.]

Average resting potential of pyramidal cells in visual cortex. We assume −70 mV.

Average AP firing threshold. We assume −50 mV.

Time constant of the neuronal membrane: 1 to 20 msec (in one study) or 8 msec (in another). We assume 8 msec.

% neurons simultaneously active during resting state (no stimulus): We assume 5%.

% neurons simultaneously active during activation: We assume 10%.

[Note: this estimate is based on the assumption that the maximal firing rate of neurons in cortex is 100 Hz. We also assume that the duration of an AP is $\approx$ 1 msec. Therefore, during maximal activation each neuron is in its active state (AP) for 1/10 of the time (10%). Therefore, 10% of all neurons are active simultaneously (at any moment).]

[Na+]$_e$ is about 140 to 160 mM. We assume 145 mM = $145 \times 10^{-9}$ moles/mm$^3$.

The number of particles in 1 mole is: $\approx 6.02 \times 10^{23}$ particles.

The EC space occupies 20 to 30% of the brain volume. We assume 20%.

On the basis of these data we can calculate:

1) The number of Na+ ions in the EC space of each 1 mm$^3$ cortical tissue:

$$0.2 \times 145 \times 10^{-9} \times 6.02 \times 10^{23} \approx 1.75 \times 10^{16} \, Na^{30} \text{ ions}$$

2) The number of Na+ ions in the IC space of each 1 mm$^3$ cortical tissue:

$$0.8 \times 15 \times 10^{-9} \times 6.02 \times 10^{23} \approx 0.72 \times 10^{16} \, Na^+ \text{ ions}$$

Factor 1: Contribution of the somatic AP:

The decrease of [Na+]$_e$ due to an A-P generation can be assessed by an adaptation of the calculations done by Koester. See Koester, "Nongated Channels and Passive Membrane Properties of the Neuron", in E. R. Kandel and J. H. Schwartz (Eds.), "Principles of Neural Science", (pp. 658–65), New York, N.Y.: Elsevier Science Publishers (1985). This method uses the membrane capacitance ($C_m$) of a neuron.

A typical value of $C_m$ is about $10^{-6}$ F/cm$^2$ of membrane area. The net excursions of positive and negative charges separated by the membrane of a neuron with a resting potential of $-70$ mV can be calculated as follows:

$$Q = V_m \times C_m = (70 \times 10^{-3}\ V) \times (10^{-6}\ F/cm^2) = 7 \times 10^{-8}\ Coul./cm^2$$

We can convert charge measured in coulombs to units of electronic charge by using the appropriate conversion factor:

$$Q = (7 \times 10^{-8}\ Coul./cm^2) \times (6.2 \times 10^{18}\ charges/Coul.) = 4.3 \times 10^{11}\ charges/cm^2$$

From the value of charge density and the membrane area, we can calculate the total amount of charge stored on the membrane capacitance.

For a neuron with a cell body that is 50 $\mu m = 5 \times 10^{-3}$ cm in diameter, the membrane area of the soma is $7.85 \times 10^{-5}$ cm$^2$, so the net charge separation across the soma membrane is:

$$Q = (7.85 \times 10^{-5}\ cm^2) \times (4.3 \times 10^{11}\ charges/cm^2) = 34 \times 10^6\ charges$$

This is only about a 1/200,000 fraction of the total number of positive or negative charges within the cytoplasm of the cell body.

During action potential, the membrane potential changes from $-70$ to $+50$ mV, a total excursion of 120 mV. The number of Na$^+$ ions that must flow into the cell to change the charge on the membrane capacitance can be determined by calculating the amount of charge required to produce this change of the membrane potential ($V_m$). From the calculation above, $34 \times 10^6$ charges must be separated across the membrane to produce a 70 mV potential difference. To change the potential by 120 mV, the change in charge separation required is:

$$(34 \times 10^6\ charges) \times (120\ mV/70\ mV) = 58 \times 10^6\ Na^+\ ions$$

This calculated value is a slight underestimation of the total Na$^{30}$ influx. A small fraction of the charge carried by Na$^{30}$ influx through the sodium channels does not contribute to changing the charge on $C_m$ because it is offset by K$^+$ efflux and Cl$^-$ influx through the other ion channels.

The value of $5.8 \times 10^7$ Na$^{30}$ ions produces only a 0.013% change in intrasomatic Na$^{30}$ concentration away from its typical value of 12 mM. (explain how this is calculated??)

Using the calculated value for the Na$^{30}$ ions flowing into one perikaryon during an AP generation ($58 \times 10^6$), and the number of neurons per 1 mm$^3$ of the cortex ($10^4$), we can calculate the change in [Na$^{30}$]$_e$ from an inactive state of the cortex (i.e. no external stimulation) to an activated state (e.g., rapid visual pattern reversal).

Assume that during activation (when the stimulus reaches the cortex) for a time period of about 50 msec all V1 pyramidal cells fire at their maximal firing rate (100 Hz—APs per second). Therefore, there will be 1 AP per neuron every 10 msec, i.e. 5 APs during the 50 msec window (the repetition time—TR). Within 1 mm$^3$ of vortex there will be a total of $5 \times 10^4$ APs during these 50 msec.

Therefore the amount of Na$^{30}$ ions which will enter the IC space (i.e. leave the EC space) during this period will be $(58 \times 10^6) \times (5 \times 10^4) = 2.9 \times 10^{12}$ ions.

Using the value for the total number of Na$^{30}$ ions in the EC space of a cortical voxel of volume 1 mm$^3$ ($1.74 \times 10^{16}$ ions) calculated above, we can calculate the % decrease of [Na$^{30}$]$_e$ due to AP generation in this volume: $(2.9 \times 10^{12}/1.74 \times 10^{16}) \times 10^2 \% \approx 0.0167\%$. In other words, the SNR is 167/1,000,000.

Factor 2: Contribution of the synaptic activation:

Estimation of the contribution of the synaptic activation is difficult since little is known about the actual numbers of synapses active at any moment during various types of stimulation, and the magnitude of their activity (i.e. the postsynaptic potential at any moment). We can assume that during maximal activation all neurons are firing with a rate of 100 Hz, also that the duration of an AP is 1 msec. The question is what is the average membrane potential of the dendritic tree (with respect to the resting of $-70$ mV). We assume that it is $-60$ mV. This assumption is based on the following consideration. Since the firing threshold potential for these neurons is about $-50$ mV, we can assume that on average the membrane potential of the dendritic tree in a neuron firing at maximal rate is between the resting and the threshold potentials. Actually this potential might be substantially higher during the period immediately after an AP when the somatic membrane potential slowly recovers from the refractory period (due to continuously impinging APs upon dendritic tree synapses). To maintain an average membrane potential of $-60$ mV in an activated state, a neuron with a dendritic tree area of $5 \times 10^{-2}$ mm$^2 = 5 \times 10^{-4}$ cm$^2$ we will need a charge separation of $(5 \times 10^{-4}\ cm^2) \times (4.3 \times 10^{11}\ charges/cm^2) \times 10/70 = 30.7 \times 10^6$ charges. Using the same method for calculating the change of [Na$^+$]$_e$ as described above (see Factor 1 calculations), we can calculate that the total change of EC sodium concentration due to factor 2 is $(30 \times 106) \times (5 \times 10^4) = 1.5 \times 10^{12}$ ions. This amounts to 0.0086% change in the EC sodium concentration. Correspondingly, the SNR 86/1,000,000.

Note that for a more adequate estimation of the EC sodium concentration during activation state we need to consider also the rate of pumping of sodium out of the neurons. However, the question of how long the sodium remains in the intracellular compartment is difficult to answer.

The total estimated change of [Na$^+$]$_e$ is the sum of the changes due to factors 1 and 2 —i.e. $0.0167\% + 0.0086\% = 0.0253\%$. The total SNR is 253/1,000,000.

SNR—ESTIMATES AND STRATEGIES FOR IMPROVEMENT

The Signal to Noise Ratio (SNR) estimated above is not very high in comparison to the SNR commonly obtained in EP measurements. There are several ways for improving the SNR amenable to the present method: (1) Increasing the number of stimulus presentations (repetitions). (2) Increasing the size of the voxel (decreasing the spatial resolution). Both strategies are reasonable and doable within the present paradigm. (3)

Increasing the strength of the constant magnetic field Bo. (4) Separate measurements of the EC and IC sodium concentration. More detailed descriptions of this methods are given below.

(1) Signal averaging:

The SNR≈SQRT(number of repetitions). For the embodiment in FIG. 8 we can calculate:

TR (repetition rate)=42 msec=0.042 sec or 24 Hz sampling rate.

Tr (trial time)=84 msec (ISI—inter-stimulus interval) or 12 Hz stimulation rate.

T (total imaging time)=60 minutes=60×60 sec=3,600 sec.

This gives us a total of 43,200 stimulations (12 stimulations/sec×3,600 sec). During each stimulation we acquire 2 different images of the same slice each 42 msec long. After 43,200 repetitions of the 42 msec bin when the activation of the visual cortex is maximal, the original SNR of 253/1,000,000 will improve SORT(43,200)=208 times. Therefore, the SNR of the ESMRI will be 208×253/1,000,000=0.052 or 5.2%.

(2) Spatial resolution:

The SNR≈measured volume. Our calculations were performed for a volume of 1 mm$^3$. If we decrease the spatial resolution to 1 cm$^3$, then this will result in a 1000 fold increase of the SNR. Notice that losing spatial resolution in this case is not very critical since the sizes of the cortical areas (e.g., in the primary visual cortex) are in the order of centimeters.

(3) Increase of Bo strength:

Increasing Bo would improve the SNR, however, MRI scanners are not yet available with field strength much greater than (2 Tesla) and it would be expensive to develop such systems for the purposes of the present invention.

(4) Measurement of both EC and IC sodium concentration changes:

Another possibility for improving SNR is to measure the IC concentration (e.g., measuring FID) and EC concentration (e.g., by 1st echo) in an interleaved fashion during the same scanning session. After that, appropriate image subtractions can be performed which can effectively allow us to sum the two signals doubling the SNR. From a pure theoretical point of view, measuring the IC concentration change is more appropriate since it is relatively larger (due to about 10 times smaller sodium concentration in the cytosole). The problem however is that about 40% of the IC sodium is MR invisible. (Also the sequence programming will be more difficult.)

Simultaneously with the neuronal activity related to the task, the brain is also involved with a variety of other electrical activities. For instance, it constantly generates endogenous potentials such as a-rhythms, b-rhythms, etc. In the case of EP measurements, such endogenous activity manifests as noise. However, the ESMRI of the present invention has the advantage that the measurements it provides are highly localized (within the 3-D volume of the brain), whereas the EP are measured remotely (with respect to the generators) as volume attenuated potentials. Also, due to the high tortuosity of the microenvironment (the EC space), the actual movement of the Na+ ions is locally restricted which favours better localization of the generators by the ESMRI technique.

In summary, on the basis of this theoretical estimation the Evoked 23Na MRI technique of the present invention permits the measurement and localization of averaged sodium currents in the interstitial space of the brain.

APPLICATIONS OF THE EVOKED 23Na MRI

The present invention can be applied to a variety of basic research problems as well as for clinical purposes.

(1) Basic research applications:

ESMRI has the potential to provide a unique research tool for measurement of the temporal aspects of the brain activity during a variety of tasks and relate this activity to the corresponding brain structures.

(2) Clinical and diagnostic applications:

a) Preventive medicine: The present invention will permit the establishment of imaging centers where people can on a regular basis have the functionality of the basic neural circuits checked. Such procedure would require monitoring the brain activity with Evoked 23Na MRI while the subjects are performing well designed batteries of motor, sensory, and cognitive tasks. After inspecting the acquired images a qualified physician can easily and with precision unreachable by current methods determine functional abnormalities within specific brain systems.

b) Patient care: The technique can be widely used for diagnostics of patients with a variety of disorders related to brain function, brain trauma and head injury as well as for monitoring the effects of various therapeutic treatments.

ADVANTAGES OF ESMRI COMPARED TO OTHER TECHNIQUES

For these reasons, the ESMRI technique of the present invention can successfully compete with other modern techniques such as EEG and MEG as well as with indirect techniques currently used for functional imaging of the brain (e.g., PET and SPECT). Its major strengths are that it provides direct (not indirect like PET of blood flow or glucose metabolism), non-invasive (compared to PET which requires radionucleotides), high spatial and temporal resolution (compared to PET) 3-D measurements and localization (not inference as EEG and MEG) of brain functions (sensory, motor, cognitive, etc.) in the normal and diseased brain. Another considerable advantage of the present invention is that it does not require costly changes in the existing MRI technological process. Further improvement in terms of spatial and temporal resolution may be achieved by modifying already existing but presently underdeveloped (as compared to proton MRI) sodium MRI machines.

Those skilled in the art can appreciate that other advantages can be obtained from the use of this invention and that modifications may be made without departing from the true spirit of the invention after studying the specification, drawings and following claims.

What is claimed is:

1. A method for measuring neuronal activity in a subject's brain, said method comprising the steps of:
   a) causing said subject's brain to generate neuronal activity;
   b) imaging sodium concentration in a portion of said brain using a nuclear magnetic resonance imaging (MRI) apparatus, said apparatus being adapted to produce sodium magnetic resonance images, wherein said magnetic resonance image is primarily a measure of the momentary extracellular sodium concentration in said portion of the subject's brain;

c) repeating said step of imaging a plurality of times after said step of causing said subject to produce neuronal activity, wherein, a plurality of said images are produced following the generation of said neuronal activity;

d) displaying said plurality of magnetic resonance images; and e) measuring neuronal activity from the location of changes in the sodium concentration between successive magnetic resonance images which correlates with the location of said neuronal activity in the brain.

2. The method of claim 1 wherein said step of imaging is repeated at intervals of time less than 50 msec apart.

3. The method of claim 2 wherein only the T2 nuclear magnetic resonance echo from the sodium atoms is measured.

4. The method of claim 1 further comprising the step of using a radio frequency pulse to drive the atoms of said sodium atoms back to equilibrium after said step of imaging is performed.

5. The method of claim 1, further comprising the step of; repeating steps a–c a plurality of times to produce a plurality of trials each consisting of a temporal sequence of images; and averaging all of the corresponding images in the plurality of trails.

6. The method of claim 1 wherein step c further comprises the step of determining the differences between successive images produced by step c, wherein said step of displaying displays only the changes in said sodium concentration in the brain.

7. The method of claim 1 wherein the step of displaying further comprises the step of displaying said plurality of magnetic resonance images superimposed over a proton MRI image of said brain.

8. The method of claim 1 wherein said step of displaying further comprises the step of displaying said images cinematically.

9. The method of claim 1 wherein said step of imaging said brain further comprises the step of creating a three-dimensional image of said brain.

10. The method of claim 1 herein said step of causing subject to produce neuronal activity comprises the step of presenting a visual stimulation to said subject.

11. The method of claim 1 wherein said step of causing said subject to produce neuronal activity comprises the step of presenting an auditory stimulation to said subject.

12. A system for measuring neuronal activity in a subject's brain, said system comprising:

means for causing said subject's brain to produce neuronal activity;

nuclear magnetic resonance imaging (MRI) means, for producing sodium magnetic resonance images, wherein said magnetic resonance images are primarily a measure of the momentary extracellular sodium concentration in said portion of the subject's brain;

host computer for controlling said MRI means to generate a temporal sequence of said images;

means for displaying said plurality of MRI images; and means for measuring neuronal activity from the location of changes in the sodium concentration between successive images which correlates with the location of neuronal activity produced by said means for said subject to produce neuronal activity.

13. The system of claim 12 wherein said host computer comprises a means for generating a pulse sequence controlling the generation of RF pulses.

14. The system of claim 13 further comprising an RF transceiver coupled to said host computer for transmitting and receiving said RF pulses, and wherein said means for generating a pulse sequence causes said RF pulses to be transmitted and received at intervals less than 50 msec apart.

15. The system of claim 14 wherein said means for generating a pulse sequence includes a means for generating a radio frequency pulse to drive the nuclei of said sodium atoms back to equilibrium after each of said images are produced.

16. The system of claim 15 wherein said means for generating a radio frequency pulse comprises a means for generating a Driven Equilibrium Fourier Transform (DEFT).

17. The system of claim 12 wherein said MRI means produces only T2 nuclear magnetic resonance echo images.

18. The system of claim 13 wherein said means for displaying displays only the changes in said sodium concentration in the brain between successive images.

19. The system of claim 13 wherein the means for displaying further comprises means for displaying said plurality of magnetic resonance images superimposed over a proton MRI image of said brain.

20. The system of claim 13 wherein said means for displaying displays said plurality of images in rapid sequence cinematically.

21. The system of claim 13 wherein said MRI means includes means for generating a three-dimensional image of a portion of said brain.

22. The system of claim 12 wherein said means for causing said subject's brain to produce neuronal activity comprises means for presenting a visual stimulation to said subject.

23. A system for measuring neuronal activity in a subject's brain, said system comprising: means for stimulating said subject's brain to produce neuronal activity;

nuclear magnetic resonance imaging (MRI) means for producing sodium magnetic resonance images, wherein said magnetic resonance images are primarily a measure of the momentary extracellular sodium concentration in said portion of the subject's brain;

host computer means for controlling said MRI means to generate a plurality of said images, each of said images comprising the T2 echo from said sodium;

means for displaying said plurality of MRI images; and means for measuring neuronal activity from the location of changes in the sodium concentration between successive images which correlates with the location of neuronal activity produced by said means for stimulating said subject to produce neuronal activity.

* * * * *

UNITED STATES PATENT AND TRADEMARK OFFICE
CERTIFICATE OF CORRECTION

PATENT NO. : 5,303,705
DATED : April 19, 1994
INVENTOR(S) : Valeriy I. Nenov

It is certified that error appears in the above-indentified patent and that said Letters Patent is hereby corrected as shown below:

Column 4 Line 10 change "(14)" to --(4)--.

Column 7 Line 4 change "discriminated" to --discriminate--.

Column 7 Line 33 change "=" to --x--.

Column 7 Line 42 change "S.Y,," to --S.K.,--.

Column 10 Line 12 change "composit" to --composite--.

Column 12 line 2 change "11" to --II--.

Column 15 Line 7 change "G." to --$G_z$--.

Column 15 Line 60 change "prefered" to --preferred--.

Column 17 Line 36 change "MRIS" to --MRIs"--.

Column 18 Line 59 change "$Na^{30"}$" to --$Na^+$--.

Column 18 Line 67 change "A-P" to --AP--.

Column 19 Line 50 change "$Na^{30"}$" to --$Na^+$--.

UNITED STATES PATENT AND TRADEMARK OFFICE
CERTIFICATE OF CORRECTION

PATENT NO. : 5,303,705
DATED : April 19, 1994
INVENTOR(S) : Valeriy I. Nenov

It is certified that error appears in the above-indentified patent and that said Letters Patent is hereby corrected as shown below:

Column 19 Line 51 change "$Na^{30}$" to --$Na+$--.

Column 19 Line 56 change "$Na^{30}$" to --$Na^+$--.

Column 19 Line 57 change "$Na^{30}$" to --$Na^+$--.

Column 19 Line 58, 59 delete "(Explain how this is calculated??)"

Column 19 Line 60 change "$Na^{30}$" to --$Na^+$--.

Column 19 Line 61 change "106" to --$10^6$--.

Column 19 Line 63 change "$[Na^{30}]_e$" to --$[Na^+]_e$--.

Column 20 Line 5 change "$Na^{30}$" to --$Na^+$--.

Column 20 Line 8 change "$Na^{30}$" to --$Na^+$--.

Column 20 Line 11 change "$[Na^{30}]_e$" to --$[Na^+]_e$--.

Column 20 Line 44 change "106" to --$10^6$--.

Column 21 Line 10 change "Tr" to --TT--.

UNITED STATES PATENT AND TRADEMARK OFFICE
CERTIFICATE OF CORRECTION

PATENT NO. : 5,303,705
DATED : April 19, 1994
INVENTOR(S) : Valeriy I. Nenov

It is certified that error appears in the above-indentified patent and that said Letters Patent is hereby corrected as shown below:

Column 21 Line 20 change "SORT" to --SQRT--.

Column 21 Line 63 change "Na$^+$" to --Na+--.

Column 23 Line 3 delete ",".

Column 23 Line 28 change "trails" to --trials--.

Column 23 Line 44 change "herein" to --wherein--.

Column 24 Line 5 after "for" insert --causing--.

Column 24 Line 28 change "13" to --12--.

Column 24 Line 31 change "13" to --12--.

Column 24 Line 35 change "13" to --12--.

Column 24 Line 38 change "13" to --12--.

Signed and Sealed this

Fifteenth Day of November, 1994

Attest:

BRUCE LEHMAN

*Attesting Officer*            *Commissioner of Patents and Trademarks*